(12) United States Patent
Bulliard et al.

(10) Patent No.: US 9,163,163 B2
(45) Date of Patent: Oct. 20, 2015

(54) MULTILAYER FILM, METHOD FOR MANUFACTURE THEREOF AND ARTICLES INCLUDING THE SAME

(75) Inventors: Xavier Bulliard, Yongin-si (KR); Kwang Hee Lee, Suwon-si (KR); Jong Jin Park, Yongin-si (KR); Yun Hyuk Choi, Seoul (KR); In Sik In, Chingju-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 1139 days.

(21) Appl. No.: 12/403,871

(22) Filed: Mar. 13, 2009

(65) Prior Publication Data

US 2010/0112270 A1    May 6, 2010

(30) Foreign Application Priority Data

Oct. 30, 2008 (KR) .................. 10-2008-0107022

(51) Int. Cl.
*C09K 19/00* (2006.01)
*C09J 7/02* (2006.01)
*H01L 51/52* (2006.01)

(52) U.S. Cl.
CPC ........... *C09J 7/0221* (2013.01); *H01L 51/5237* (2013.01); *Y10T 428/1059* (2015.01); *Y10T 428/239* (2015.01)

(58) Field of Classification Search
CPC ... C09J 7/0221; C09J 153/00; H01L 51/5237; H01L 51/5253; B32B 27/08; Y10T 428/10; Y10T 428/1059; Y10T 428/239

USPC .............. 524/505, 515; 428/1.1, 1.5, 78, 688; 313/512; 427/407.1; 152/270, 269
See application file for complete search history.

(56) References Cited

U.S. PATENT DOCUMENTS

| | | | |
|---|---|---|---|
| 4,753,845 A | 6/1988 | Sumi et al. | |
| 5,139,903 A * | 8/1992 | Malhotra | 430/18 |
| 6,509,098 B1 | 1/2003 | Merrill et al. | |
| 7,163,727 B2 | 1/2007 | Su et al. | |
| 2003/0119970 A1* | 6/2003 | Husemann et al. | 524/505 |
| 2006/0061272 A1* | 3/2006 | McCormick et al. | 313/512 |

FOREIGN PATENT DOCUMENTS

| EP | 1 760 527 A1 | 3/2007 |
|---|---|---|
| JP | 2000-211075 | 8/2000 |

OTHER PUBLICATIONS

Kane et al "Microstructure of AXB Troblock Copolymer Possessing Lamellar Morphology", Feb. 1994, V27, pp. 1267-1273.*

* cited by examiner

*Primary Examiner* — Ruiyun Zhang
(74) *Attorney, Agent, or Firm* — Cantor Colburn LLP

(57) ABSTRACT

A multilayer film is provided. The multilayer film includes a barrier layer and an adhesive layer underlying the barrier layer. The adhesive layer contains a block copolymer that can phase separate into two or more different domains. The multilayer film has good gas and moisture barrier properties and is highly flexible. Therefore, the multilayer film can be effectively used in manufacturing encapsulation structures for electronic devices. In addition, the multilayer film is suitable for use as a substrate for a device. Further provided are a method for producing the multilayer film and an encapsulation structure including the multilayer film.

22 Claims, 4 Drawing Sheets

10

20

30

MULTILAYER FILM, METHOD FOR MANUFACTURE THEREOF AND ARTICLES INCLUDING THE SAME

CROSS-REFERENCE TO RELATED APPLICATION

This application claims priority to Korean Patent Application No. 10-2008-107022, filed on Oct. 30, 2008, and all the benefits accruing therefrom under 35 U.S.C. §119, the contents of which in its entirety are herein incorporated by reference.

BACKGROUND

1. Field

This disclosure is directed to a multilayer film, a method for producing the multilayer film, and an article including the multilayer film. In particular, it is related to an encapsulating structure that includes the multilayer film.

2. Description of the Related Art

With recent rapid advances in electronics technology, articles such as flat panel displays, including liquid crystal displays, plasma displays, electroluminescence (EL) displays and light-emitting diodes are seeing widespread commercial use. Particularly, EL displays have drawn considerable attention due to their advantages of high luminescence efficiency, wide viewing angle and rapid response speed.

A typical organic EL device of an EL display has a structure in which an organic multilayer film that includes a light-emitting layer, a hole injecting layer and an electron injecting layer is interposed between a pair of electrodes on a substrate. The organic EL device utilizes a phenomenon in which electrons injected from the electron injecting layer recombine with holes injected from the hole injecting layer in the light-emitting layer to emit light.

The light-emitting layer of the organic EL device is composed of an organic fluorescent material. High sensitivity of the organic fluorescent material to environmental factors, such as moisture and oxygen, may make the metal electrodes (which are formed directly on the light-emitting layer or separately from the light-emitting layer by the hole injecting layer/electron injecting layer), susceptible to oxidation, resulting in a rapid deterioration in the luminescent properties of the organic EL device when being driven under ambient conditions. Thus, encapsulation of the organic EL device is used to protect the EL device from attack by moisture, oxygen, and the like, and to extend the lifetime of the EL device.

A general thin-film encapsulation material for an organic EL device contains alternating polymer layers and inorganic barrier layers. The inorganic barrier layers serve to prevent moisture and gases from entering the EL device, while the polymer layers serve as buffers to relieve internal stress of the inorganic barrier layers or fill fine cracks or pin holes present in the inorganic barrier layers.

The polymer layers are mainly formed by depositing an acrylic or epoxy monomer under vacuum and curing the monomer by UV or E-beam irradiation or plasma-polymerizing the monomer under vacuum. Alternatively, the polymer layers are formed by coating a monomer (in its liquid state) via spin coating or casting at atmospheric pressure and irradiating the coating with UV light to cure the monomer. The inorganic barrier layers can be formed using a variety of materials (e.g., metals, metal oxides and metal nitrides) with good gas and moisture barrier properties by processes, such as, for example, sputtering, chemical vapor deposition and E-beam deposition.

In the formation of the polymer layers, after the monomer is directly deposited on a substrate under vacuum, the monomer is in a liquid state prior to curing. This causes the monomer to be adsorbed on the surface of the organic EL device or to be diffused into the device, resulting in a deterioration in the characteristics of the device.

Further, UV irradiation for curing the monomer may bring about additional deterioration in the characteristics of the organic EL device and its principal constituent organic materials. In particular, when a polymer layer formed in direct contact with the organic EL device it may fatally impair the characteristics of the organic EL device.

The organic EL device is directly exposed to plasma during plasma polymerization for the formation of the polymer layers. This exposure may degrade the organic materials or make the structure of the device unstable, which has a direct influence on the characteristics of the organic EL device.

Most processes for the formation of the inorganic barrier layers employ a variety of plasma sources depending on the processing conditions, thus making it difficult to form the inorganic barrier layer in direct contact with the organic EL device. In conclusion, it is desirable to develop a suitable process for the formation of the organic polymer layer that is in direct contact with the organic EL device. A suitable process that can be used to dispose an organic polymer layer in contact with the organic EL device can improve the characteristics of the device.

SUMMARY

Disclosed herein is a multilayer film that includes a barrier layer and an adhesive layer underlying the barrier layer; the adhesive layer underlying the barrier layer that includes a block copolymer that forms two or more different domains.

In one exemplary embodiment, the block copolymer has a soft block repeat unit and a hydrophilic third block repeat unit. In one exemplary embodiment, the soft block repeat unit is selected from the group consisting of a first block repeat unit having a glass transition temperature ("$T_g$") of 50 degrees Celsius ("° C.") or less, a second block repeat unit having a glass transition temperature higher than 50° C. but not higher than 150° C. and a surface energy between 30 and 50 milliNewtons per meter ("mN/m"), and a combination thereof.

Also disclosed herein is a method for producing a multilayer film that includes dissolving a block copolymer having a soft block repeat unit and a hydrophilic third block repeat unit in a solvent, the soft block repeat unit being selected from the group consisting of a first block repeat unit having a glass transition temperature ($T_g$) of 50° C. or less, a second block repeat unit having a glass transition temperature higher than 50° C. but not higher than 150° C. and a surface energy between 30 and 50 mN/m, and a combination thereof; coating the solution on a substrate to form an adhesive layer having two or more different domains; and forming a barrier layer on the adhesive layer.

Also disclosed herein is an encapsulation structure including a substrate, a light-emitting member formed on the substrate and a multilayer film encapsulating the light-emitting member.

Also disclosed herein is a device including the multilayer film as a substrate.

BRIEF DESCRIPTION OF THE DRAWINGS

The above and other aspects, advantages, and features of the invention will become more apparent by describing in further detail exemplary embodiments thereof with reference to the attached drawings, in which.

DETAILED DESCRIPTION

Figure 1:
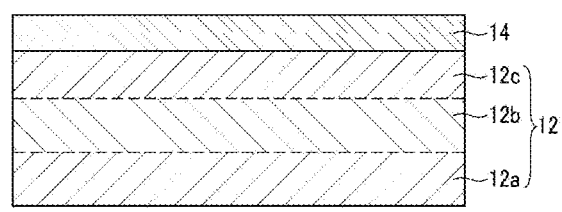
FIGS. 1, 2 and 3 are cross-sectional views of exemplary embodiments of a multilayer film.

Exemplary embodiments will now be described in greater detail hereinafter with reference to the accompanying drawings, in which embodiments of the invention are shown. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on, the other element or intervening elements may be present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Unless otherwise specified, alkyl, alkylene and alkoxy groups as used herein represent $C_1$-$C_{20}$ alkyl, $C_1$-$C_{20}$ alkylene and $C_1$-$C_{20}$ alkoxy, respectively.

In one embodiment, there is provided a multilayer film that includes a barrier layer and an adhesive layer underlying the barrier layer and containing a block copolymer wherein the block copolymer phase separates into two or more different domains.

An exemplary structure of the multilayer film 10 is illustrated in FIG. 1. As illustrated in FIG. 1, the multilayer film 10 includes an adhesive layer 12 and a barrier layer 14 overlying the adhesive layer 12. In one embodiment, the adhesive layer 12 contacts the barrier layer 14.

The multilayer film 10 can be used to encapsulate a device formed on a substrate. The substrate is incompatible with the barrier layer 14 because the substrate is commonly made of an organic material and the barrier layer 14 is formed from an inorganic material. This incompatibility causes a problem in that the barrier layer 14 tends to peel off from the substrate. This problem can be solved by forming the adhesive layer 12 using an amphiphilic block copolymer that is compatible with both organic and inorganic materials, and disposing the adhesive layer 12 under the barrier layer 14.

The block copolymer contained in the adhesive layer 12 has two or more block repeat units capable of forming separate domains. In one exemplary embodiment, the block copolymer has a soft block repeat unit and a hydrophilic third block repeat unit. In one exemplary embodiment, the soft block repeat unit is selected from the group consisting of a first block repeat unit having a glass transition temperature ($T_g$) of 50° C. or less, a second block repeat unit having a glass transition temperature higher than 50° C. but not higher than 150° C. and a surface energy between 30 and 50 mN/m, and a combination thereof. The block copolymer forms two or more separate domains in the adhesive layer 12. The characteristics of the domains formed in the adhesive layer 12 are attributed to intrinsic properties of the repeat block units of the block copolymer.

The first block repeat unit may be derived from an elastic rubber having a glass transition temperature of 50° C. or less. In one embodiment, the elastic rubber may be one having a glass transition temperature of 20° C. or less. In another embodiment, the elastic rubber may be one having a glass transition temperature of 0° C. or less. The first block repeat unit may be used individually or may be covalently reacted with a second block repeat unit in a soft block domain 12*b*.

The elastic rubber may be selected from diene rubbers (polydienes), siloxane rubbers, acrylic rubbers, alkylene rubbers, thermoplastic elastomers, and other rubbers. Examples of suitable diene rubbers include polyisoprene; polybutadiene; isoprene-butadiene copolymers; polybutenylene; poly(alkylbutenylene), such as poly(ethylbutenylene), poly(butylbutenylene), poly(propylbutenylene), poly(isopropylbutenylene), poly(heptylbutenylene), poly(dimethylbutenylene) and poly(decylbutenylene); poly(halobutenylene), such as poly(chlorobutenylene) and poly(bromobutenylene); polyisobutylene(butyl rubber); poly(halobutylene), such as poly(chlorobutylene) and poly(bromobutylene); polychloroprene; polyvinylethylene; ethylene-propylene-diene rubbers; isoprene-butylene-butyl rubbers; butadiene-acrylonitrile rubbers; styrene-butadiene rubbers; poly(ethylene-co-butene); poly(propylene-co-butene), or a combination comprising at least one of the foregoing diene rubbers.

It is to be understood that the unsaturated bonds in the diene rubbers may be partly or wholly hydrogenated. For example, at least 50 mol % of the unsaturated bonds in the diene rubbers may be hydrogenated.

Examples of suitable siloxane rubbers may be polysiloxane such as polydimethylsiloxane. Examples of suitable acrylic rubbers include alkyl acrylate rubbers, such as butyl acrylate and neopentyl acrylate rubbers; and dialkylaminoalkyl acrylate rubbers, such as dimethylaminoethyl acrylate. Examples of suitable alkylene rubbers include alkylene-vinyl acetate copolymers, such as ethylene-vinyl acetate copolymers; ethylene-propylene copolymers; and polyisobutylene. An exemplary embodiment of the thermoplastic elastomers may be poly(ϵ-caprolactone).

In one embodiment, the first block repeat unit may have a weight average molecular weight of about 1,000 to about 200,000 grams per mole ("g/mol") and a polydispersity index ($M_w/M_n$) of about 1 to about 1.3. In one embodiment, the weight average molecular weight of the first block repeat unit may be from about 5,000 to about 100,000 g/mol. The first block repeat unit whose weight average molecular weight and dispersity are within the respective ranges defined above is self-arranged so that the soft block domain can be clearly distinguished from the other domains.

The characteristics of the second block repeat unit are intermediate between those of the first and third block repeat units. In one exemplary embodiment, the second block repeat unit is composed of a polymer having a glass transition temperature higher than about 50° C. but not higher than about 150° C. and a surface energy of about 30 to about 50 mN/m. The second block repeat unit may have a glass transition temperature of about 80° C. to about 130° C.

The polymer used in the second block repeat unit may be selected from the group consisting of polystyrene; polyalkyl methacrylate, such as polyneopentyl methacrylate and polymethyl methacrylate; polyvinylpyridine; polyvinylnaphthalene; and copolymers thereof. The second block repeat unit serves to improve the affinity of the first block repeat unit with the third block repeat unit and may be positioned between domains of the first and third block repeat units.

The second block repeat unit may either replace or exist together with the first block repeat unit. The second block repeat unit is positioned either alone or together with the first block repeat unit in the soft block domain 12b.

In one exemplary embodiment, the second block repeat unit may have a weight average molecular weight of about 1,000 to about 200,000 g/mol and a polydispersity index ($M_w/M_n$) of about 1 to about 1.3. In one embodiment, the weight average molecular weight of the second block repeat unit may be from about 5,000 to about 100,000 g/mol. The second block repeat unit whose weight average molecular weight and dispersity are within the respective ranges defined above is self-arranged so that the soft block domain 12b can be clearly distinguished from the other domains.

The third block repeat unit may comprise a hydrophilic polymer. In one exemplary embodiment, the third block repeat unit may have a contact angle for water of about 60 degrees ("°") or less and a surface energy of at least about 35 mN/m. In one embodiment, the surface energy of the third block repeat unit may be at least about 40 mN/m. The contact angle of the third block repeat unit is determined by dropping deionized water and diiodomethane onto the surface of the film using syringes at ambient temperature and pressure conditions to form droplets and measuring the angles between a tangent to the surface of the droplets and the film surface. The surface energy of the third block repeat unit is calculated from the measured contact angle values using a program such as the Wu or Fowkes model. The contact angle and surface energy values mentioned herein are those obtained under the same conditions described above.

The hydrophilic polymer may have hydrophilic groups selected from the group consisting of carboxylic acid groups, sulfonic acid groups, (meth)acrylic acid groups, alkyl(meth)acrylic acid groups, salts of these acid groups, and alkylene oxide groups. In the salts of the acid groups, the hydrogen atoms of the acid groups are partly replaced by alkali metals. Examples of the hydrophilic polymer include polyalkylene oxides, such as polyethylene oxide; poly(meth)acrylic acid, poly(meth)acrylamide, and polyalkyl(meth)acrylate, such as polypropyl(meth)acrylate. Each of the alkylene and alkyl groups may comprise about one to about five carbon atoms.

In one embodiment, the third block repeat unit may have a weight average molecular weight of about 1,000 to about 200,000 g/mol and a polydispersity index ($M_w/M_n$) of about 1 to about 1.3. The weight average molecular weight of the third block repeat unit may be from about 5,000 to about 100,000 g/mol. The third block repeat unit whose weight average molecular weight and dispersity are within the respective ranges defined above self-arranges itself so that the hydrophilic domains are clearly distinguishable from the other domains that are formed.

The diblock copolymer may comprise the first and third block repeat units or the second and third block repeat units, or a triblock copolymer comprising the first, second and third block repeat units. It should be understood that the third block repeat unit may be present on both surfaces of the first or second block repeat unit to form a triblock copolymer. Alternatively, the first or second block repeat unit may be positioned on both surfaces of the third block repeat unit to form a triblock copolymer.

The block copolymer may be selected from the group consisting of poly(isoprene-b-ethylene oxide) (PI-b-PEO), poly(butadiene-b-ethylene oxide) (PBu-b-PEO), poly(methyl(meth)acrylate-b-(meth)acrylic acid), poly(butadiene-b-(meth)acrylic acid), poly(butadiene-b-sodium acrylate), poly(isoprene-b-sodium acrylate), poly(ethylene-co-butene-b-ethylene oxide), poly(propylene-co-butene-b-ethylene oxide), poly(ϵ-caprolactone-b-ethylene oxide), poly(methyl(meth)acrylate-b-ethylene oxide), poly(dimethylaminoethyl(meth)acrylate-b-ethylene oxide), poly(butyl(meth)acrylate-b-ethylene oxide), poly(dimethylsiloxane-b-(meth)acrylic acid), poly(dimethylsiloxane-b-ethylene oxide), poly(vinyl naphthalene-b-(meth)acrylic acid), poly(styrene-b-(meth)acrylic acid), poly(styrene-b-ethylene oxide), poly(styrene-b-(meth)acrylic acid), poly(isobutylene-b-ethylene oxide), and a combination comprising at least one of the foregoing block copolymers.

The block copolymer contained in the adhesive layer 12 may have a contact angle for water between about 200 to about 800 and a surface energy of about 40 to about 60 mN/m. The use of the block copolymer whose weight average molecular weight and dispersity are within the respective ranges defined above allows the adhesive layer 12 to have high affinity for and good adhesion to a device substrate in contact with the adhesive layer 12 and the barrier layer 14.

The block copolymer having the block repeat units may be used alone or in combination with one or more other block copolymers. The constituent block repeat units having similar characteristics may be aligned in a predetermined orientation to form domains 12a, 12b and 12c in the adhesive layer 12. That is, the soft block repeat unit selected from the group consisting of the first and second block repeat units and a combination thereof forms the soft block domain 12b, and the third block repeat unit forms the hydrophilic domains 12a and 12c.

Each of the domains 12a, 12b and 12c divided by the orientation of the block repeat units may have a thickness in the range of about 3 to about 100 nanometers ("nm"). The thicknesses of the domains 12a, 12b and 12c may be controlled by varying the weight average molecular weights and the polydispersity of the respective constituent blocks that contain the respective repeat units of the block copolymer.

As detailed above, the block copolymer contained in the adhesive layer 12 has a soft block repeat unit selected from a first block repeat unit, a second block repeat unit and a combination thereof, and a hydrophilic third block repeat unit. In other words, the block copolymer has two or more block repeat units with different characteristics. The first, second and third block repeat units are arranged periodically in an alternating manner to form different domains in the adhesive layer. The block copolymer is arranged in the form of an alternating block copolymer with the first, second and third block repeat units arranged periodically in an alternating manner.

The first, second and third block repeat units are self-arranged so as to be aligned in a predetermined direction in the adhesive layer 12. The alignment of the block copolymer in a predetermined direction allows the multilayer film 10 to have two or more different domains with specific characteristics.

In one embodiment, the soft block domain 12b is formed of the soft block repeat unit and is selected from the group consisting of the first and second block repeat units and a combination thereof. The domain 12b is positioned inside the adhesive layer 12, with the hydrophilic domain 12a being in contact with a device substrate and the hydrophilic domain 12c being in contact with the barrier layer 14. Thus the hydrophilic domain 12a is positioned on one side of the soft block domain 12b, while the hydrophilic domain 12c is positioned on the opposing surface of the soft block domain 12b from the surface that contacts the hydrophilic domain 12a.

In the case of a polyisoprene-polyethylene oxide block copolymer (PI-b-PEO), the polyisoprene unit as the first block repeat unit may form the soft block domain 12b inside the adhesive layer 12 to improve the flexibility of the multilayer film, and the polyethylene oxide unit as the third block repeat unit may form the hydrophilic domains 12a and 12c on both surfaces of the soft block domain 12b to improve the affinity of the adhesive layer 12 to a device substrate and to the barrier layer 14.

In the adhesive layer 12 of the multilayer film 10, the hydrophilic domains 12a and 12c and the soft block domain 12b are arranged alternately. The barrier layer 14 may be in contact with the hydrophilic domain 12c.

A plurality of adhesive layers 12 may be provided to contact the barrier layer or the device substrate as desired. In one embodiment, in order to obtain the plurality of adhesive layers, the hydrophilic domains 12a and 12c and the soft block domain 12b may be repeatedly laminated to one another.

In one exemplary embodiment, the barrier layer 14 overlying the adhesive layer 12 may comprise an inorganic layer, an organic/inorganic hybrid layer, or a laminate comprising an organic layer and an inorganic layer.

The inorganic layer may comprise an inorganic material selected from the group consisting of metal oxides, metal nitrides, metal carbides, metal oxynitrides, metal borides, and mixtures thereof. The metals may be selected from the group consisting of Group 2A, Group 3A, Group 4A, Group 5A, Group 6A, Group 7A, Group 1B, Group 2B, Group 3B, Group 4B, Group 5B, rare earth elements in the Periodic Table, and a combination comprising at least one of the foregoing metals.

The metal oxides may be selected from the group consisting of aluminum oxide, silicon oxide, zirconium oxide, titanium oxide, chromium oxide, magnesium oxide, tin oxide, indium tin oxide, indium oxide, tantalum oxide, copper oxide, zinc oxide, cesium oxide, and a combination comprising at least one of the foregoing metal oxides. The metal nitrides may be selected from the group consisting of aluminum nitride and silicon nitride ($Si_3N_4$). An exemplary embodiment of the metal carbides is silicon carbide, and an exemplary embodiment of the metal oxynitrides is silicon oxynitride (SiON). The metal borides may be selected from the group consisting of aluminum boride, silicon boride, a combination comprising at least one of the foregoing metal borides. Of these, silicon oxide may be used as a material for the barrier layer 14 due to its good moisture barrier properties. The inorganic layer 14 may be formed using a mixture of two or more different inorganic materials or by laminating two or more layers composed of different inorganic materials.

The organic/inorganic hybrid layer may be formed by plasma deposition of an inorganic precursor such as tetraethoxysilane and a low-molecular weight hydrocarbon. In one embodiment, the organic/inorganic hybrid layer may be formed by the reaction of an inorganic precursor such as tetraethoxysilane with itself.

The low-molecular weight hydrocarbon may be, for example, an alkene, an alcohol, an aldehyde, an ether, an aromatic compound or an alkylene oxide comprising up to about 15 carbon atoms. In one embodiment, the low-molecular weight hydrocarbon can comprise about 1 to about 15 carbon atoms.

The laminate of organic/inorganic layers may comprise of one or more (meth)acrylate polymer layers as organic layers and one or more inorganic layers. The organic and inorganic layers may be laminated in any order. For example, the organic and inorganic layer may be repeatedly laminated in an alternating manner.

The thickness of the barrier layer 14 may be about 5 to about 300 nm.

Figure 2:
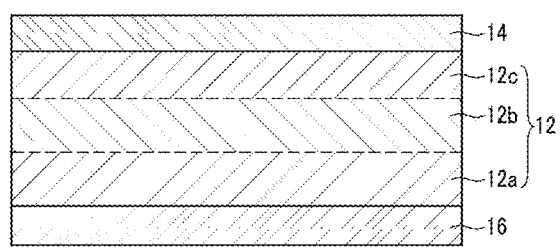

The multilayer film 10 of FIG. 2 may further include a support layer 16 under the adhesive layer 12.

FIG. 2 illustrates an exemplary structure 20 of the multilayer film 10. There is no particular restriction on the material for the support layer 16. For example, the support layer 16 may be a film made of a resin capable of withstanding heat during application and which facilitates the drying of the block copolymer composition during the formation of the overlying layer and during subsequent device encapsulation. The support layer 16 may be formed of the same resin as the device substrate for good adhesion between the substrate and the support layer 16.

The resin may be selected from the group consisting of polyalkylene terephthalate, such as polyethylene terephthalate and polybutylene terephthalate; polyalkylene naphthalate, such as polyethylene naphthalate; polycarbonate; polyolefin, such as polypropylene and polyethylene; polybutene; polybutadiene; polyalkylpentene, such as polymethylpentene; polyvinylchloride; triacetyl cellulose; polyethersulfone; polyurethane; polyalkylene vinyl acetate, such as polyethylene vinyl acetate; ionomer resins; alkylene-(meth)acrylic acid copolymers, such as ethylene-(meth)acrylic acid copolymers; alkylene-(meth)acrylate copolymers, such as ethylene-(meth)acrylate copolymers; polystyrene; polyimide; polyamide; polyamideimide; fluorine resins; copolymers thereof; and a combination comprising at least one of the foregoing resins. The support layer 16 may be a laminate of two or more films comprising different resins selected from the above-mentioned resins. The thickness of the support layer may be in the range of about 5 micrometers ("μm") to about 300 μm.

In one exemplary embodiment, the hydrophilic domains 12a and 12c of the adhesive layer 12 may further contain an inorganic material to convert the adhesive layer 12 to an organic/inorganic hybrid adhesive layer, which exhibits better affinity for and adhesion to the barrier layer 14 than the adhesive layer 12. The inorganic material may be the same as that for the barrier layer 14. The inorganic material may also be present only in the hydrophilic domain 12c that is in contact with the barrier layer 14.

The organic/inorganic hybrid adhesive layer may be formed in a simple manner by applying a mixture of the inorganic material and the block copolymer having the hydrophilic third block repeat unit. For example, an inorganic metal oxide precursor is added to the block copolymer having the third block repeat unit and is the inorganic metal oxide is hydrolyzed into a corresponding metal oxide. The mixture is applied to a substrate to form the desired organic/inorganic hybrid adhesive layer. The inorganic metal oxide precursor is localized in the hydrophilic domains 12a and 12c due to its affinity for the hydrophilic third block repeat unit.

The inorganic material may be present in an amount of about 1 to about 10 parts by weight, based on 100 parts by weight of the block copolymer constituting the hydrophilic domains 12a and 12c. Within the weight range specified above, the organic/inorganic hybrid adhesive layer can be effectively formed without any impediment to the self-arrangement of the block copolymer by the inorganic material. The inorganic metal oxide precursor may be freely selected depending on the intended metal.

Figure 3:
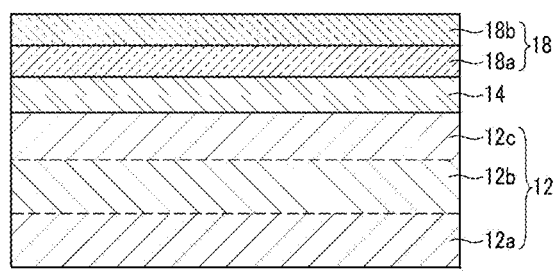

In one exemplary embodiment, the multilayer film 10 may further include a hydrophobic protective layer on the barrier layer 14 to protect the barrier layer 14 from damage by the ambient environment. An exemplary structure 30 of the multilayer film 10 is illustrated in FIG. 3. The hydrophobic protective layer 18 comprises a polymer having a $C_1$-$C_{20}$ fluoroalkyl or alkyl group as a hydrophobic functional group.

In one exemplary embodiment, the hydrophobic protective layer 18 may comprise a block copolymer having a hydrophobic first block repeat unit and a second hydrophilic block repeat unit. In one exemplary embodiment, the hydrophobic first block repeat unit forms a hydrophobic domain 18b and the hydrophilic second block repeat unit forms a hydrophilic domain 18a in the hydrophobic protective layer 18. The hydrophobic domain 18b and the hydrophilic domain 18a may be alternatively provided in plurality. In one embodiment, the hydrophilic domain 18a may be in contact with the barrier layer 14.

The hydrophobic first block repeat unit may have a hydrophobic functional group, and an exemplary example thereof may be one derived from a monomer of Formula 1:

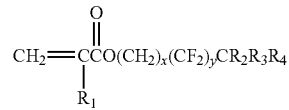

(1)

wherein $R_1$ is hydrogen or $C_1$-$C_{10}$ alkyl, $R_2$, $R_3$ and $R_4$, which may be the same or different, are selected from the group consisting of hydrogen, fluorine, $C_1$-$C_{10}$ alkyl and $C_1$-$C_{10}$ fluoroalkyl, x and y are each independently an integer from 0 to about 20, and the sum of x and y is not less than 5.

The monomer of Formula 1 may be represented by Formula 1a:

(1a)

In one exemplary embodiment, the hydrophobic first block repeat unit may have a weight average molecular weight of about 1,000 to about 200,000 g/mol and a polydispersity index ($M_w/M_n$) of about 1 to about 1.3. The weight average molecular weight of the hydrophobic first block repeat unit may be from about 5,000 to about 100,000 g/mol.

The hydrophobic first block repeat unit may have a contact angle for water of at least about 900 and a surface energy of about 30 mN/m or less. The contact angle between water and the hydrophobic first block repeat unit may be from about 100° to about 120°. The surface energy of the hydrophobic first block repeat unit may be from about 10 to about 30 mN/m. The presence of the hydrophobic first block repeat unit whose contact angle with water and surface energy are within the respective ranges defined above may allow the hydrophobic protective layer 18 to sufficiently protect the underlying barrier layer 14 and have a high affinity for the barrier layer 14.

An exemplary example of the hydrophilic second block repeat unit may be one derived from a monomer of Formula 2:

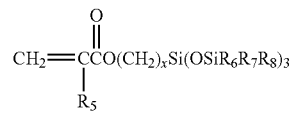

(2)

wherein $R_5$ is hydrogen or $C_1$-$C_{10}$ alkyl; and $R_6$, $R_7$ and $R_8$, which may be the same or different, are selected from the group consisting of hydrogen, $C_1$-$C_{10}$ alkyl and alkoxy, with the proviso that at least one of $R_6$, $R_7$ and $R_8$ is alkyl or alkoxy, and x is an integer from about 1 to about 10.

The monomer of Formula 2 may be represented by Formula 2a:

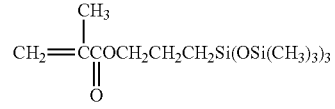

(2a)

In one exemplary embodiment, the hydrophilic second block repeat unit constituting the hydrophilic domain 18a may have a weight average molecular weight of about 1,000 to about 200,000 g/mol and a polydispersity index ($M_w/M_n$) of about 1 to about 1.3. The weight average molecular weight of the hydrophilic second block repeat unit may be from about 5,000 to about 100,000 g/mol.

In one exemplary embodiment, the hydrophilic second block repeat unit may have a contact angle with water greater than or equal to about 60° but smaller than about 90° and a surface energy greater than about 30 mN/m but not greater than about 40 mN/m.

The block copolymer contained in the hydrophobic protective layer 18 may have a contact angle with water of at least about 90° and a surface energy of about 40 mN/m or less. The presence of the block copolymer whose contact angle with water and surface energy are within the respective ranges defined above may allow the hydrophobic protective layer 18 to have high affinity for and good adhesion to the underlying barrier layer 14 and exhibit good water barrier properties.

The hydrophobic protective layer 18 may have a thickness of about 50 nm to about 1 μm. Each of the domains 18a and 18b of the hydrophobic protective layer 18 composed of the block copolymer may have a thickness of about 10 to about 200 nm. The thicknesses of the domains 18a and 18b may be controlled by varying the weight average molecular weights and the polydispersity of the respective constituent block repeat units of the block copolymer.

In one exemplary embodiment, the hydrophilic domain 18a of the hydrophobic protective layer 18 may further contain an inorganic material to convert the hydrophobic protective layer 18 to an organic/inorganic hybrid adhesive layer, which exhibits better affinity for and adhesion to the barrier layer 14 than the hydrophobic protective layer 18. The inorganic material may be the same as that for the barrier layer 14.

The organic/inorganic hybrid adhesive layer may be formed in a simple manner by applying a mixture of the inorganic material and the block copolymer having the hydrophilic block repeat unit. For example, an inorganic oxide precursor is added to the block copolymer having the hydrophilic block repeat unit. The inorganic oxide precursor is then hydrolyzed into the corresponding inorganic material. The mixture is applied to a substrate to form the desired organic/inorganic hybrid adhesive layer. The inorganic oxide precursor is localized in the hydrophilic domain 18a due to its affinity for the hydrophilic block repeat unit. The inorganic material may be present in an amount of about 1 to about 10 parts by weight, based on 100 parts by weight of the block copolymer constituting the hydrophilic domain 18a. Within the weight range specified above, the organic/inorganic hybrid adhesive layer can be effectively formed without any impediment to the self-arrangement of the block copolymer by the inorganic material. The inorganic oxide precursor may be freely selected depending on the desired metal.

In accordance with another embodiment, there is provided a method for producing the multilayer film 10.

According to the method, the multilayer film 10 is produced by the following procedure. First, a block copolymer having a soft block repeat unit and a hydrophilic third block repeat unit is dissolved in a solvent. The soft block repeat unit is selected from the group consisting of a first block repeat unit having a glass transition temperature ($T_g$) of about 50° C. or less, a second block repeat unit having a glass transition temperature higher than about 50° C. but not higher than about 150° C. and a surface energy between about 30 and about 50 mN/m, and a combination thereof. Then, the solution is coated on a substrate. The block copolymer is as explained above. The solvent is not limited so long as it dissolves the block copolymer and can be removed from the mixture in a subsequent drying step. For example, the solvent may be selected from the group consisting of tetrahydrofuran, dimethylformamide, toluene, N-methyl-2-pyrrolidone, dimethylacetamide, diethylene glycol dimethyl ether, cyclohexanone, methyl ethyl ketone, chloroform, and a combination comprising at least one of the foregoing solvents. The substrate can be a release film. The substrate may be the support layer 16 of the multilayer film 20 illustrated in FIG. 2.

The coating may be carried out by methods including spin coating, screen printing, spray coating, doctor blade coating, gravure coating, dip coating, silk screening, painting, and a combination comprising at least one of the foregoing methods.

The coated solution is annealed to remove the solvent. In the course of the annealing, the block copolymer undergoes self-arrangement to form an adhesive layer 12 having two or more domains. The annealing may be carried out under vacuum at a temperature of about 60 to about 130° C.

A barrier layer 14 is formed on the adhesive layer 12 to produce the multilayer film 10 or 20 (FIGS. 1 and 2). The barrier layer 14 may be an inorganic layer formed by deposition or wet coating of an inorganic material; an organic/inorganic hybrid layer formed by co-deposition of an inorganic precursor and a low-molecular weight hydrocarbon or by deposition of an inorganic precursor. In one embodiment, the barrier layer 14 can be a laminate of an organic layer formed by coating and polymerization of a (meth)acrylate monomer, oligomer or resin and an inorganic layer formed by the deposition or wet coating of an inorganic material such that the inorganic material is in contact with the organic layer. The deposition may be carried out by various processes, such as sputtering, chemical vapor deposition (CVD), physical vapor deposition (PVD) and ion plating. The wet coating may be carried out by a plating or sol-gel process.

A hydrophobic protective layer 18 is formed in the same manner as the adhesive layer 12. That is, a block copolymer having a hydrophobic first block repeat unit and a hydrophilic second block repeat unit is dissolved in a solvent. The solution is applied to the barrier layer 14, followed by annealing to produce the multilayer film 30 (FIG. 3). The multilayer film 30 may further include the support layer 16.

An inorganic precursor may be coated together with the block copolymer having the hydrophilic block repeat unit of the adhesive layer 12 or the hydrophobic protective layer 18 to form an organic/inorganic hybrid layer. For example, an alkoxide compound (e.g., an inorganic metal oxide precursor) is coated together with the block copolymer, followed by a sol-gel process to induce hydrolysis. As a result, a corresponding inorganic metal oxide is dispersed in the hydrophilic domains 12a and 12c or the hydrophilic domain 18a.

The inorganic metal oxide precursor may be represented by Formula 3:

$$M(R)_x(R')_y \qquad (3)$$

wherein M is selected from the group consisting of silicon (Si), aluminum (Al), titanium (Ti), zirconium (Zr), chromium (Cr), magnesium (Mg), indium (In), and tin (Sn), and R and R' are each independently selected from the group consisting of hydrogen, chlorine, alkoxy and alkyl, with the proviso that at least one of R and R' is an alkoxy group.

A mixture of two or more alkoxide compounds of Formula 3 may be used as the inorganic metal oxide precursor. In Formula 3, the sum of x and y is determined depending on the valence of M. The alkoxy may comprise about 1 to about 5 carbon atoms and the alkyl group may comprise about 1 to about 10 carbon atoms.

The multilayer films 10, 20 and 30 of the FIGS. 1, 2 and 3, may be used to manufacture encapsulation structures for devices. Exemplary embodiments 100, 200 and 300 of the encapsulation structures are illustrated in the FIGS. 4, 5 and 6, respectively.

Figure 4:
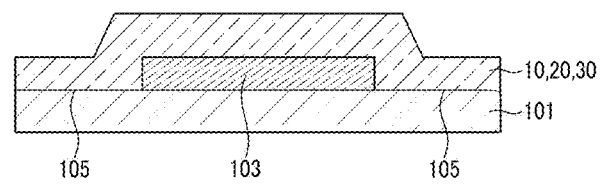
FIGS. 4, 5 and 6 are cross-sectional views of exemplary embodiments of encapsulation structures using the multilayer films of FIGS. 1, 2 and 3, respectively.

As illustrated in the FIG. 4, the multilayer film 10, 20 or 30 is disposed on a substrate 101 and a light-emitting member 103 is disposed on the substrate 101 at the multilayer film/substrate interface 105. In one embodiment, the light-emitting member 103 is adhesively bonded to the substrate 101 at the multilayer film/substrate interface 105. This adhesive bonding may be performed by heat melting or ultrasonic welding.

The light-emitting member 103 includes a pair of electrodes and a light-emitting layer interposed between the electrodes. The light-emitting layer may have a multilayer structure.

The substrate 101 may be made of glass, plastic, or the like, or a combination comprising a glass and a plastic. The plastic substrate may be selected from the group consisting of polyalkylene terephthalate, such as polyethylene terephthalate and polybutylene terephthalate; polyalkylene naphthalate, such as polyethylene naphthalate; polycarbonate; polyolefin, such as polypropylene and polyethylene; polybutene; polybutadiene; polyalkylpentene, such as polymethylpentene; polyvinylchloride; triacetyl cellulose; polyethersulfone; polyurethane; polyalkylene vinyl acetate, such as polyethylene vinyl acetate; ionomer resins; alkylene-(meth)acrylic acid copolymers, such as ethylene-(meth)acrylic acid copolymers; alkylene-(meth)acrylate copolymers, such as ethylene-(meth)acrylate copolymers; polystyrene; polyimide; polyamide; polyamideimide; fluorine resins; copolymers thereof; and a combination comprising at least one of the foregoing resins. The substrate 101 may be manufactured from the same material as the support layer 16 for better adhesion between the substrate 101 and the support layer 16.

Figure 5:
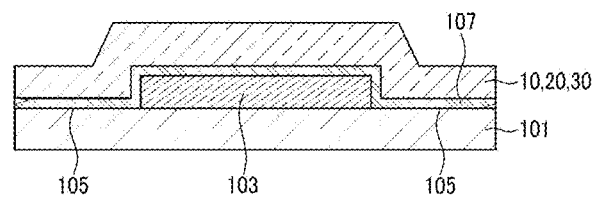
Figure 6:
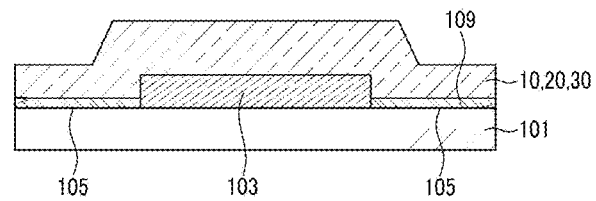

The encapsulation structure 200 of FIG. 5 further includes an adhesive sheet 107 disposed between the multilayer film 10, 20 or 30 and the substrate 101. The encapsulation structure 300 of FIG. 6 further includes an adhesive sheet 109 disposed at the multilayer film/substrate interface 105. The adhesive sheets 107 and 109 may be made of an acrylic or an epoxy resin. The adhesive sheets 107 and 109 may contain a hygroscopic agent without the need to form a moisture-absorbing layer. Hygroscopic agents such as calcium, silica gel, zeolite, and the like, may be used.

The multilayer film 10, 20 or 30 may be formed on the substrate 101 and the light-emitting member 103 by direct coating. Even when the adhesive layer 12 is directly formed on the light-emitting member 103 by wet processing, it does not adversely effect the characteristics of the device because additional processes, such as plasma polymerization of the monomers, is not performed. Further, even when the barrier layer 14 is formed on the adhesive layer 12, there is no influence on the characteristics of the device because the adhesive layer 12 serves to protect the barrier layer 14.

The multilayer films may also be used as device substrates. For example, a display device may be fabricated by forming first and second electrodes on one of the multilayer films and forming an organic thin film between the first and second electrodes. A plastic film may be interposed between the multilayer film and the overlying electrode.

The encapsulation structures 100, 200 and 300 may be encapsulated display devices, semiconductor devices and other devices commonly known in the related art. As the display devices, there may be exemplified organic electroluminescence devices, liquid crystal display devices, electron emission devices, electroluminescent display devices, and the like. The multilayer films 10, 20 and 30 may also be suitable for the encapsulation of organic photoconductors (OPCs), photorefractive devices, charge coupled devices (CCDs), photochromic devices, photodiodes, solar cells, and other devices.

A more detailed description of exemplary embodiments will be described in more detail with reference to the following examples. However, these examples are given merely for the purpose of illustration and are not to be construed as limiting the scope of the embodiments.

EXAMPLES

Example 1

Production of Multilayer Film

A polyisoprene-polyethylene oxide block copolymer (PI-b-PEO, $M_w$=26,000/14,500 g/mole for the PI block and the PEO block respectively, $M_w/M_n$=1.05) is dissolved in a mixed solvent of tetrahydrofuran/chloroform/toluene (in a volume ratio of tetrahydrofuran/chloroform/toluene of 2:1:1) until the concentration of the block copolymer reaches 2 weight percent ("wt %") in the solvent.

The solution is spin-coated on a 20 μm thick polyether sulfone substrate (manufactured by i-component) at 1,500 revolutions per minute ("rpm") for 40 seconds, followed by annealing in a vacuum oven at 120° C. for 1.5 hour to form a 150 nm thick adhesive layer. A barrier layer is formed by depositing aluminum oxide ($Al_2O_3$) to a thickness of 150 nm on the adhesive layer to produce a multilayer film (FIG. 2).

Example 2

Production of Multilayer Film

A polyisoprene-polyethylene oxide block copolymer (PI-b-PEO, $M_w$=26,000/14,500 g/mole for the PI block and the PEO block respectively, $M_w/M_n$=1.05) is dissolved in a mixed solvent of tetrahydrofuran/chloroform/toluene (in a volume ratio of tetrahydrofuran/chloroform/toluene 2:1:1 ( ) until the concentration reaches 3 wt %, and then aluminum tert-butoxide (Formula 4) is added in an amount of 10 parts by weight, based on 100 parts by weight of the block copolymer.

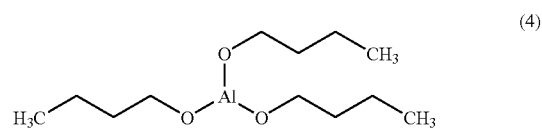

(4)

A small amount of hydrochloric acid (Aldrich, No. 318949) in water is added to induce hydrolysis of the inorganic material. The amount of water is a stoichiometric amount that is used for the complete hydrolysis of the metal alkoxide groups and the amount of hydrochloric acid is $5\times10^{-5}$ wt % when compared with aluminum tert-butoxide. After stirring for 1.5 hour, the mixture is spin-coated on a 20 μm thick polyether sulfone substrate (manufactured by i-component) at 1,500 rpm for 40 seconds, followed by annealing in a vacuum oven at 120° C. for 1.5 hour to form a 150 nm thick adhesive layer. A barrier layer is formed by depositing Al$_2$O$_3$ to a thickness of 150 nm on the adhesive layer to produce a multilayer film (FIG. 2).

Example 3

Production of Multilayer Film

A block copolymer of the monomers of Formulae 1a and 2a are dissolved in tetrahydrofuran until the concentration of the block copolymer reaches 1.5 w %.

(1a)

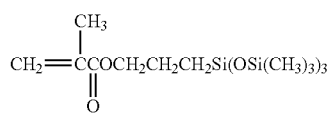
(2a)

A 150 nm thick hydrophobic protective layer is formed by spin-coating the solution at 1,500 rpm for 40 seconds on the multilayer film of Example 1 to produce a multilayer film.

Example 4

Production of Multilayer Film

A multilayer film is produced in the same manner as in Example 1, except that a polybutadiene-polyethylene oxide block copolymer is used.

Example 5

Production of Multilayer Film

A multilayer film is produced in the same manner as in Example 2, except that a polybutadiene-polyethylene oxide block copolymer is used.

Identification of Domains in the Multilayer Film

Figure 7:
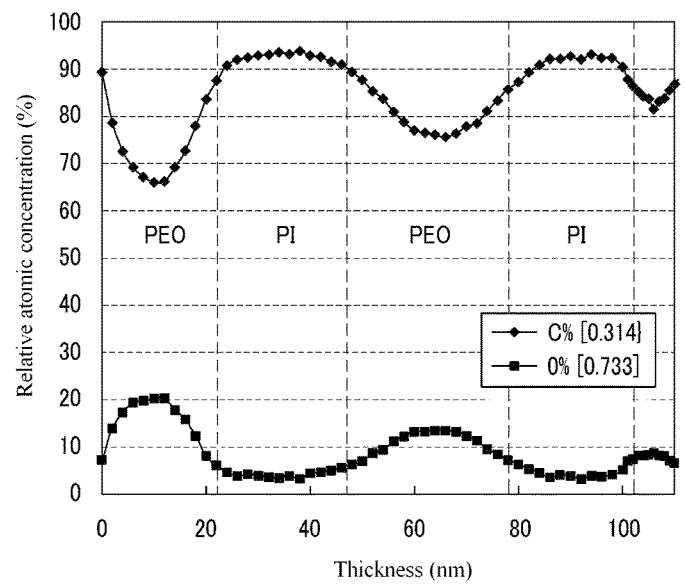
FIG. 7 shows the results of X-ray photoelectron spectroscopy (XPS) for an adhesive layer of a multilayer film produced in Example 1.

The distributions of carbon and oxygen atoms in the adhesive layer of the multilayer film produced in the Example 1 are measured by X-ray photoelectron spectroscopy (XPS) to identify whether or not different domains are formed in the adhesive layer. The results are shown in FIG. 7. FIG. 7 shows the analytical results of elemental distribution in the adhesive layer before the aluminum oxide (Al$_2$O$_3$) barrier layer is formed. In FIG. 7, zero ("0") nm represents the interface of the adhesive layer in contact with the barrier layer. As shown in FIG. 7, an increase in the number of oxygen atoms reveals the presence of C—O bonds, demonstrating the formation of polyethylene oxide (PEO) block domains in the adhesive layer. Further, a decrease in the number of oxygen atoms reveals the dominant presence of C—C bonds, demonstrating the formation of polyisoprene (PI) block domains in the adhesive layer. From these observations, it can be concluded that PEO, PI, PEO, PI and PEO block domains are repeatedly formed in this order from the top of the adhesive layer.

Figure 8:
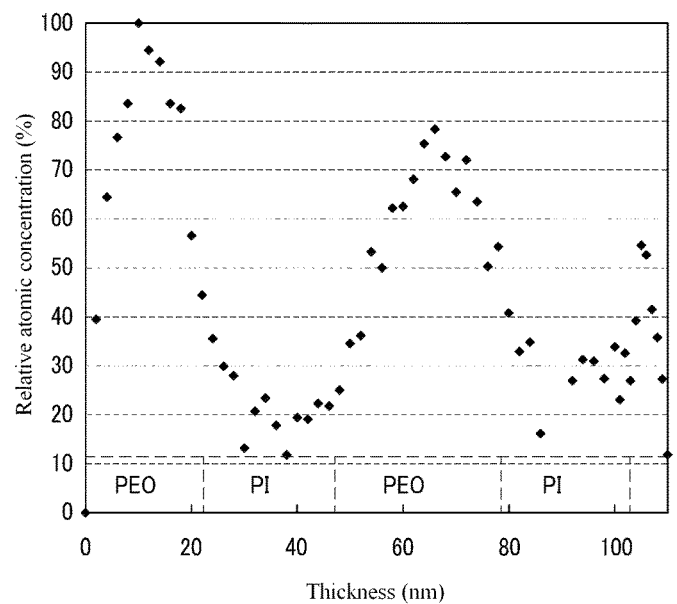
FIG. 8 shows the results of X-ray photoelectron spectroscopy (XPS) for Al content in an adhesive layer of a multilayer film produced in Example 2.

Identification on the Formation of the Organic/Inorganic Hybrid Adhesive Layer in the Multilayer Films The distribution of aluminum (Al) in the organic/inorganic hybrid adhesive layer of the multilayer film produced in Example 2 is measured by XPS. The results are shown in FIG. 8. It can be observed from FIG. 8 that Al atoms are localized in the PEO block repeat units forming the hydrophilic domains, demonstrating the formation of the Al$_2$O$_3$/PEO organic/inorganic hybrid layer in the hydrophilic domains.

Measurements of Contact Angle and Surface Energy of the Multilayer Film

Figure 9:
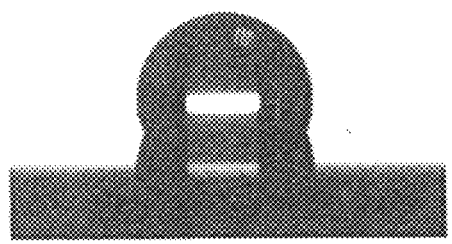
FIG. 9 is a photograph showing water dropped on the surface of a multilayer film produced in Example 3 to measure the contact angle of the multilayer film.

After 3 microliters ("μl") of deionized water is dropped on the surface of the multilayer film produced in Example 3 using a contact angle tester (Kruess), a photograph is taken (FIG. 9). The contact angle between the droplet and the surface of the multilayer film is found to be 115°. The same experiment is conducted using diiodomethane instead of deionized water, and as a result, the contact angle between the diiodomethane and the surface of the multilayer film is found to be 67°. The surface energy of the multilayer film is found to be 24.5 mN/m, which is calculated from the measured contact angle values using the Fowkes model.

Measurement of Water Permeability of the Multilayer Film

The water permeability of the multilayer film produced in Example 5 is measured using an Aquatran model 1, MOCON (USA) at RH 100% and 38° C. After 30 hr, the multilayer film has a water vapor transmission rate of about $8 \times 10^{-2}$ grams per square meter day (g/M$^2$·day). It can be confirmed from this observation that the multilayer film has good moisture barrier properties.

As is apparent from the above description, exemplary embodiments of the multilayer film can be suitable for use in various products requiring protection from oxygen or water vapor due to their good gas and moisture barrier properties and high flexibility. Particularly, exemplary embodiments of the multilayer film can be useful for the encapsulation of flat panel display devices (such as organic EL devices) that are sensitive to oxygen or water vapor. Further, exemplary embodiments of the multilayer film can be effectively used as substrates for display devices.

Although exemplary embodiments have been described herein with reference to the foregoing preferred embodiments, those skilled in the art will appreciate that various modifications and changes are possible without departing from the spirit of the invention as disclosed in the accompanying claims. Therefore, it is to be understood that such modifications and changes are encompassed within the scope of the invention.

What is claimed is:

1. A multilayer film, comprising:
   a barrier layer; and
   an adhesive layer underlying the barrier layer, the adhesive layer comprising block copolymers that form two or more different domains in a horizontal direction,
   wherein the block copolymers include a soft block repeat unit including a first block repeat unit and a second block repeat unit, and a hydrophilic third block repeat unit, and
   the second block repeat unit improves affinity of the first block repeat unit with the third block repeat unit and is positioned between domains of the first and third block repeat units, and
   the soft block repeat unit is interposed between the third block repeat units in a vertical direction perpendicular to the horizontal direction in a cross sectional view.

2. The multilayer film of claim 1, wherein the first block repeat unit has a glass transition temperature (Tg) of about 50° C. or less, and the second block repeat unit has a glass transition temperature higher than about 50° C. but not higher than about 150° C. and a surface energy between about 30 and about 50 mN/m.

3. The multilayer film of claim 1, wherein the barrier layer is selected from the group consisting of inorganic layers, organic/inorganic hybrid layers, and laminates of organic layers and inorganic layers.

4. The multilayer film of claim 2, wherein each of the first, second and third block repeat units has a weight average molecular weight of from about 1,000 to about 200,000 grams per mole and a polydispersity index (Mw/Mn) of from about 1 to about 1.3.

5. The multilayer film of claim 2, wherein the third block repeat unit has a contact angle with water of about 60 degree or less and a surface energy of at least about 35 mN/m.

6. The multilayer film of claim 2, wherein the soft block repeat unit forms a soft block domain inside the adhesive layer and the third block repeat unit forms hydrophilic domains on both surfaces of the soft block domain.

7. The multilayer film of claim 2, wherein the soft block repeat unit forms a soft block domain, the third block repeat unit forms hydrophilic domains, and the soft block domain and the hydrophilic domains are arranged alternatively.

8. The multilayer film of claim 2, wherein the soft block repeat unit forms a soft block domain, the third block repeat unit forms hydrophilic domains, and the barrier layer is in contact with one of the hydrophilic domains.

9. The multilayer film of claim 2, wherein the soft block repeat unit forms a soft block domain, the third block repeat unit forms hydrophilic domains, and the hydrophilic domains further contain an inorganic material.

10. The multilayer film of claim 1, further comprising a hydrophobic protective layer on the barrier layer wherein the hydrophobic protective layer contains a block copolymer having a hydrophobic first block repeat unit and a hydrophilic second block repeat unit.

11. The multilayer film of claim 10, wherein the hydrophobic first block repeat unit forms a hydrophobic domain and the hydrophilic second block repeat unit forms a hydrophilic domain in contact with the barrier layer.

12. The multilayer film of claim 10, wherein the hydrophobic first block repeat unit forms a hydrophobic domain, the hydrophilic second block repeat unit forms a hydrophilic domain, and the hydrophilic domain further contains an inorganic material.

13. The multilayer film of claim 10, wherein each of the hydrophobic first block repeat unit and the hydrophilic second block repeat unit has a weight average molecular weight of from about 1,000 to about 200,000 grams per mole and a polydispersity index (Mw/Mn) of from about 1 to about 1.3.

14. A method for producing a multilayer film, the method comprising:
dissolving a block copolymer having a soft block repeat unit and a hydrophilic third block repeat unit in a solvent to form a solution, the soft block repeat unit including a first block repeat unit having a glass transition temperature (Tg) of about 50° C. and a second block repeat unit having a glass transition temperature higher than about 50° C. but not higher than about 150° C. and a surface energy between about 30 and about 50 mN/m;
coating the solution on a substrate to form an adhesive layer having two or more different domains in a horizontal direction; and
forming a barrier layer on the adhesive layer, wherein the soft block repeat unit is interposed between the hydrophilic third block repeat units in a vertical direction perpendicular to the horizontal direction in a cross sectional view.

15. The method of claim 14, wherein each of the first, second and third block repeat units has a weight average molecular weight of from about 1,000 to about 200,000 grams per mole and a polydispersity index (Mw/Mn) of from about 1 to about 1.3.

16. The method of claim 14, wherein the third block repeat unit has a contact angle with water of about 60 degree or less and a surface energy of at least about 35 mN/m.

17. The method of claim 14, wherein the solution further contains an inorganic precursor to convert hydrophilic domains formed by the third block repeat unit to organic/inorganic hybrid hydrophilic domains containing a corresponding inorganic material.

18. The method of claim 14, further comprising applying a solution of a block copolymer having a hydrophobic first block repeat unit and a hydrophilic second block repeat unit in a solvent to the barrier layer to form a hydrophobic protective layer.

19. The method of claim 18, wherein the solution further contains an inorganic precursor to convert a hydrophilic domain formed by the hydrophilic second block repeat unit to an organic/inorganic hybrid hydrophilic domain containing a corresponding inorganic material.

20. An encapsulation structure comprising a substrate, a light-emitting member formed on the substrate, and the multilayer film of claim 1 encapsulating the light-emitting member.

21. A device comprising the multilayer film of claim 1 as a substrate.

22. A multilayer film, comprising:
a barrier layer; and
an adhesive layer underlying the barrier layer, the adhesive layer comprising block copolymers that form two or more different domains in a horizontal direction,
wherein the block copolymers include a soft block repeat unit including a first block repeat unit and a second block repeat unit, and a hydrophilic third block repeat unit, and
the second block repeat unit improves affinity of the first block repeat unit with the third block repeat unit and is positioned between domains of the first and third block repeat units, and
the soft block repeat unit is interposed between the third block repeat units in a vertical direction perpendicular to the horizontal direction in a cross sectional view.

* * * * *